United States Patent
Zhang et al.

(10) Patent No.: US 11,475,864 B2
(45) Date of Patent: Oct. 18, 2022

(54) DISPLAY PANEL, METHOD OF MANUFACTURING THE SAME, METHOD OF DRIVING THE SAME AND DISPLAY DEVICE

(71) Applicant: BOE TECHNOLOGY GROUP CO., LTD., Beijing (CN)

(72) Inventors: Can Zhang, Beijing (CN); Han Yue, Beijing (CN); Minghua Xuan, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 68 days.

(21) Appl. No.: 17/050,380

(22) PCT Filed: Apr. 16, 2020

(86) PCT No.: PCT/CN2020/085088
§ 371 (c)(1),
(2) Date: Oct. 23, 2020

(87) PCT Pub. No.: WO2020/259019
PCT Pub. Date: Dec. 30, 2020

(65) Prior Publication Data
US 2021/0248977 A1    Aug. 12, 2021

(30) Foreign Application Priority Data

Jun. 25, 2019 (CN) .......................... 201910553970.7

(51) Int. Cl.
*G09G 5/10* (2006.01)
*G09G 3/32* (2016.01)
(Continued)

(52) U.S. Cl.
CPC ................. *G09G 5/10* (2013.01); *G09G 3/32* (2013.01); *H01L 25/167* (2013.01);
(Continued)

(58) Field of Classification Search
CPC . H01L 25/167; H01L 27/1214; H01L 31/173; H01L 33/62; H01L 31/02327;
(Continued)

(56) References Cited

U.S. PATENT DOCUMENTS 6,288,979 B1    9/2001  Kwok
6,323,923 B1   11/2001  Hoshino et al.
(Continued)

FOREIGN PATENT DOCUMENTS

CN    102540565 A    7/2012
CN    103810981 A    5/2014
(Continued)

OTHER PUBLICATIONS

Office Action of CN Application No. 201910553970.7 and English translation, dated May 18, 2020, 13 pages.
(Continued)

*Primary Examiner* — Vinh T Lam
(74) *Attorney, Agent, or Firm* — Muncy, Geissler, Olds & Lowe, P.C.

(57) ABSTRACT

A display panel, a method of manufacturing the display panel, a method of driving the display panel and a display device are provided. The display panel includes an array substrate and a plurality of micro light-emitting diodes arranged on the array substrate, and further includes: a photoelectric conversion structure in a one-to-one correspondence with a micro light-emitting diode, the photoelectric conversion structure is located on a side of the corresponding micro light-emitting diode facing the array substrate, connected to the corresponding micro light-emitting diode, and configured to convert a received light signal emitted by the micro light-emitting diode into an electrical (Continued)

signal, and charge the corresponding micro light-emitting diode by using the electrical signal. The display panel is used for display.

15 Claims, 3 Drawing Sheets

(51) Int. Cl.
*H01L 25/16* (2006.01)
*H01L 27/12* (2006.01)
*H01L 31/0232* (2014.01)
*H01L 31/105* (2006.01)
*H01L 33/62* (2010.01)

(52) U.S. Cl.
CPC .... *H01L 27/1214* (2013.01); *H01L 31/02327* (2013.01); *H01L 31/105* (2013.01); *H01L 33/62* (2013.01); *G09G 2300/0861* (2013.01); *G09G 2320/0626* (2013.01); *H01L 2933/0066* (2013.01)

(58) Field of Classification Search
CPC ............... H01L 31/105; H01L 27/1251; H01L 25/0753; H01L 2933/0066; H01L 33/58; G09G 3/3233; G09G 3/32; G09G 5/10; G09G 2300/0426; G09G 2300/0861; G09G 2300/0819; G09G 2320/0626; G09G 2300/0842
See application file for complete search history.

(56) References Cited

U.S. PATENT DOCUMENTS

| | | | | |
|---|---|---|---|---|
| 7,875,882 B2 * | 1/2011 | Morita | ................ | H01L 27/3244 257/90 |
| 9,472,588 B1 * | 10/2016 | Li | .................... | H01L 27/14652 |
| 10,068,884 B2 | 9/2018 | Takeya et al. | | |
| 10,192,934 B2 * | 1/2019 | Yamazaki | ........... | H01L 27/3246 |
| 10,390,397 B1 * | 8/2019 | Chen | .................... | G09G 3/3225 |
| 10,446,615 B2 * | 10/2019 | Yamazaki | ........... | H01L 27/3211 |
| 10,593,271 B1 * | 3/2020 | Chen | .................... | H05B 45/44 |
| 10,692,432 B2 * | 6/2020 | Zhang | ................. | G09G 3/3225 |
| 10,825,393 B2 * | 11/2020 | Kim | ....................... | H01L 27/156 |
| 10,930,213 B2 * | 2/2021 | Liang | ................. | H01L 51/5209 |
| 2007/0046593 A1 * | 3/2007 | Shin | ...................... | G09G 3/3233 345/81 |
| 2012/0306939 A1 * | 12/2012 | Choi | ...................... | G09G 3/006 345/77 |
| 2013/0181232 A1 * | 7/2013 | Jeromerajan | ....... | H01L 31/0203 257/E31.108 |
| 2015/0302793 A1 * | 10/2015 | In | .............................. | G09G 5/18 345/82 |
| 2015/0364107 A1 * | 12/2015 | Sakariya | ................. | G06F 3/042 345/82 |
| 2016/0019864 A1 | 1/2016 | Li et al. | | |
| 2018/0122310 A1 | 5/2018 | Wang et al. | | |
| 2019/0148611 A1 | 5/2019 | He et al. | | |
| 2019/0235677 A1 * | 8/2019 | Liu | ........................ | G06F 3/042 |
| 2021/0366394 A1 * | 11/2021 | Gai | ...................... | G09G 3/3291 |

FOREIGN PATENT DOCUMENTS

| | | | | |
|---|---|---|---|---|
| CN | 105489186 A | | 4/2016 | |
| CN | 105761629 A | | 7/2016 | |
| CN | 108230991 A | * | 6/2018 | .............. G09G 3/32 |
| CN | 108538241 A | | 9/2018 | |
| CN | 108538254 A | | 9/2018 | |
| CN | 109148506 A | | 1/2019 | |
| CN | 109741684 A | | 5/2019 | |
| CN | 110277053 A | | 9/2019 | |
| EP | 1152304 A3 | | 10/2003 | |
| EP | 3131073 A1 | * | 2/2017 | ............ G01N 21/53 |
| KR | 20180053864 A | | 5/2018 | |
| WO | WO-2011034908 A1 | * | 3/2011 | ............ B82Y 20/00 |

OTHER PUBLICATIONS

International Search Report of PCT/CN2020/085088 and English translation, dated Jul. 1, 2020, 18 pages.

* cited by examiner

DISPLAY PANEL, METHOD OF MANUFACTURING THE SAME, METHOD OF DRIVING THE SAME AND DISPLAY DEVICE

CROSS-REFERENCE TO RELATED APPLICATIONS

The present application is the U.S. national phase of PCT Application No. PCT/CN2020/085088 filed on Apr. 16, 2020, which claims a priority of the Chinese patent application No. 201910553970.7 filed on Jun. 25, 2019, which are incorporated herein by reference in their entirety.

TECHNICAL FIELD

The present disclosure relates to the field of display technology, in particular to a display panel, a method of manufacturing the display panel, a method of driving the display panel and a display device.

BACKGROUND

A Micro Light-Emitting Diode (Micro-LED) display panel has been widely used in a consumer terminal (such as a mobile phone, a tablet computer) due to such characteristics as a low driving voltage and a long service life.

SUMMARY

In one aspect, a display panel is provided in some embodiments of the present disclosure, including an array substrate and a plurality of micro light-emitting diodes arranged on the array substrate, and further including: a plurality of photoelectric conversion structures in a one-to-one correspondence with the plurality of micro light-emitting diodes. The photoelectric conversion structure is located on a side of the corresponding micro light-emitting diode facing the array substrate, connected to the corresponding micro light-emitting diode, and configured to convert a received light signal emitted by the corresponding micro light-emitting diode into an electrical signal, and charge the corresponding micro light-emitting diode by using the electrical signal.

In a possible embodiment of the present disclosure, the photoelectric conversion structure includes: a photoelectric conversion diode, a control transistor and a storage capacitor. A first anode of the photoelectric conversion diode is connected to a second anode of the corresponding micro light-emitting diode, and a first cathode of the photoelectric conversion diode is connected to a second cathode of the corresponding micro light-emitting diode. A gate electrode of the control transistor is connected to a light emission control signal input terminal, a first electrode of the control transistor is connected to the second anode of the corresponding micro light-emitting diode, and a second electrode of the control transistor is connected to a first terminal of the storage capacitor. And a second terminal of the storage capacitor is connected to the second cathode of the corresponding micro light-emitting diode.

In a possible embodiment of the present disclosure, the array substrate includes a plurality of pixel driving circuits in a one-to-one correspondence with the plurality of micro light-emitting diodes, each pixel driving circuit includes a driving transistor, and an output electrode of the driving transistor is connected to the second anode of the corresponding micro light-emitting diode. The photoelectric conversion diode includes the first anode, a PIN junction and the first cathode that are sequentially stacked, and the first anode is located between the corresponding micro light-emitting diode and the first cathode.

In a possible embodiment of the present disclosure, the first anode includes a transparent electrode, and the first cathode and the output electrode of the driving transistor are arranged at a same layer and made of a same material.

In a possible embodiment of the present disclosure, the driving transistor further includes a first gate electrode and a second gate electrode that form the storage capacitor.

In a possible embodiment of the present disclosure, the display panel further includes: a planarization layer located between the array substrate and the plurality of micro light-emitting diodes and including a first via hole, a second via hole and a third via hole that are separate from each other, a pixel electrode located on a side of the planarization layer away from the array substrate and connected to the output electrode of the corresponding driving transistor through the first via hole, and a connection electrode located on the side of the planarization layer away from the array substrate and connected to the first cathode through the second via hole. The PIN junction is located in the third via hole and connected to the first cathode through the third via hole, the second anode of the micro light-emitting diode is connected to the corresponding pixel electrode, and the second cathode of the micro light-emitting diode is connected to the corresponding connection electrode.

In a possible embodiment of the present disclosure, the first anode, the pixel electrode and the connection electrode are arranged at a same layer and made of a same material.

In a possible embodiment of the present disclosure, the display panel further includes: a plurality of lens structures in a one-to-one correspondence with the plurality of micro light-emitting diodes. The lens structure is located between the corresponding micro light-emitting diode and the corresponding photoelectric conversion structure, and configured to converge the light emitted by the corresponding micro light-emitting diode and transmit the light to the corresponding photoelectric conversion structure.

In a possible embodiment of the present disclosure, the lens structure includes: a groove part and a filling part filled in the groove part. An opening of the groove part faces the micro light-emitting diode, and an inner wall of the groove part is of an arc-shape. A surface of the filling part away from the groove part and a surface surrounding the opening in the groove part together form a flat surface, and a refractive index of the filling part is larger than a refractive index of the groove part.

In a possible embodiment of the present disclosure, an orthographic projection of a PN junction of the micro light-emitting diode on a substrate of the array substrate is within an orthographic projection of the filling part on the substrate.

In a possible embodiment of the present disclosure, the PN junction of the micro light-emitting diode is located on a focal plane of the corresponding lens structure.

In a possible embodiment of the present disclosure, the PN junction of the micro light-emitting diode is located on the flat surface.

In a possible embodiment of the present disclosure, a maximum width D of the filling part in a direction parallel to the array substrate, a maximum depth H of the filling part in a direction perpendicular to the array substrate, and a focal length f are calculated by using the following formulas:

$$f = \frac{n_1 r}{n_2 - n_3} \quad (1)$$

$$\frac{D^2}{4} + (r - H)^2 = r^2 \quad (2)$$

$$n_2 - n_3 = \frac{n_1 r}{f} \geq \frac{n_1 D}{2f} \quad (3)$$

where, r represents a curvature radius of the filling part, n1 represents a refractive index of the PN junction of the micro light-emitting diode, n2 represents the refractive index of the filling part, and n3 represents the refractive index of the groove part.

In another aspect, a display panel is further provided in some embodiments of the present disclosure, including an array substrate and a plurality of micro light-emitting diodes arranged on the array substrate, and further including: a plurality of photoelectric conversion structures in a one-to-one correspondence with the plurality of micro light-emitting diodes. The photoelectric conversion structure is located on a side of the corresponding micro light-emitting diode facing the array substrate, and the photoelectric conversion structure is connected to the corresponding micro light-emitting diode, and configured to convert a received light signal emitted by the micro light-emitting diode into an electrical signal, and charge the corresponding micro light-emitting diode by using the electrical signal. The array substrate includes a plurality of pixel driving circuits in a one-to-one correspondence with the plurality of micro light-emitting diode, each pixel driving circuit includes the photoelectric conversion structure including a photoelectric conversion diode, a ninth transistor and a storage capacitor, a first anode of the photoelectric conversion diode is connected to a second anode of the corresponding micro light-emitting diode, a first cathode of the photoelectric conversion diode is connected to a second cathode of the corresponding micro light-emitting diode, a gate electrode of the ninth transistor is connected to a light emission control signal input terminal, a first electrode of the ninth transistor is connected to the second anode of the corresponding micro light-emitting diode, a second electrode of the ninth transistor is connected to a first terminal of the storage capacitor, and a second terminal of the storage capacitor is connected to the second cathode of the corresponding micro light-emitting diode. Each pixel driving circuit further includes a first transistor, a second transistor, a third transistor, a fourth transistor, a fifth transistor, a sixth transistor, a seventh transistor, an eighth transistor, a first capacitor and a third capacitor. A gate electrode of the first transistor is connected to a reset control terminal, a first electrode of the first transistor is connected to a reset signal input terminal, and a second electrode of the first transistor is connected to a second electrode of the second transistor. A gate electrode of the second transistor is connected to a first gate control signal input terminal, a first electrode of the second transistor is connected to a second electrode of the fourth transistor, and a gate electrode of the fourth transistor is connected to the second electrode of the second transistor. A first terminal of the first capacitor is connected to a second electrode of the fifth transistor, and a second terminal of the first capacitor is connected to the second electrode of the second transistor. A gate electrode of the fifth transistor is connected to the light emission control signal input terminal, and a first electrode of the fifth transistor is connected to a first electrode of the fourth transistor. A gate electrode of the third transistor is connected to the first gate electrode control signal input terminal, a first electrode of the third transistor is connected to a first data signal input terminal, and a second electrode of the third transistor is connected to the first electrode of the fourth transistor. A gate electrode of the sixth transistor is connected to the light emission control signal input terminal, a first electrode of the sixth transistor is connected to the second electrode of the fourth transistor, and a second electrode of the sixth transistor is connected to a first electrode of the eighth transistor. A second electrode of the eighth transistor is connected to the second anode of the micro light-emitting diode, a gate electrode of the eighth transistor is connected to a first terminal of the third capacitor, and a second terminal of the third capacitor is connected to a second electrode of the seventh transistor. A first electrode of the seventh transistor is connected to a second data signal input terminal, a gate electrode of the seventh transistor is connected to a second gate control signal input terminal, and the second cathode of the micro light-emitting diode is connected to a ground signal line.

In another aspect, a display device including the display panel is further provided in some embodiments of the present disclosure.

In another aspect, a method of manufacturing the display panel is further provided in some embodiments of the present disclosure, including: forming the array substrate; forming the plurality of photoelectric conversion structures arranged on the array substrate; and forming the plurality of micro light-emitting diodes on the side of the plurality of photoelectric conversion structures away from the array substrate. The plurality of micro light-emitting diodes are in one-to-one correspondence with the plurality of photoelectric conversion structures, the photoelectric conversion structure is connected to the corresponding micro light-emitting diode, and configured to convert the received light signal emitted by the micro light-emitting diode into the electrical signal, and charge the corresponding micro light-emitting diode by using the electrical signal.

In another aspect, a method of driving the display panel is further provided in some embodiments of the present disclosure, including: in a brightness compensation step, converting, by the photoelectric conversion structure in the display panel, the received light signal emitted by the micro light-emitting diode into the electrical signal, and charging the corresponding micro light-emitting diode by using the electrical signal.

BRIEF DESCRIPTION OF THE DRAWINGS

The following drawings are provided to facilitate the understanding of the present disclosure, and constitute a portion of the present disclosure. These drawings and the following embodiments are for illustrative purposes only, but shall not be construed as limiting the present disclosure. In these drawings.

DETAILED DESCRIPTION

In order to further illustrate a display panel, a method of manufacturing the display panel, a method of driving the display panel and a display device in the embodiments of the present disclosure, a detailed description will be given below with reference to the accompanying drawings in the specification.

Figure 1:
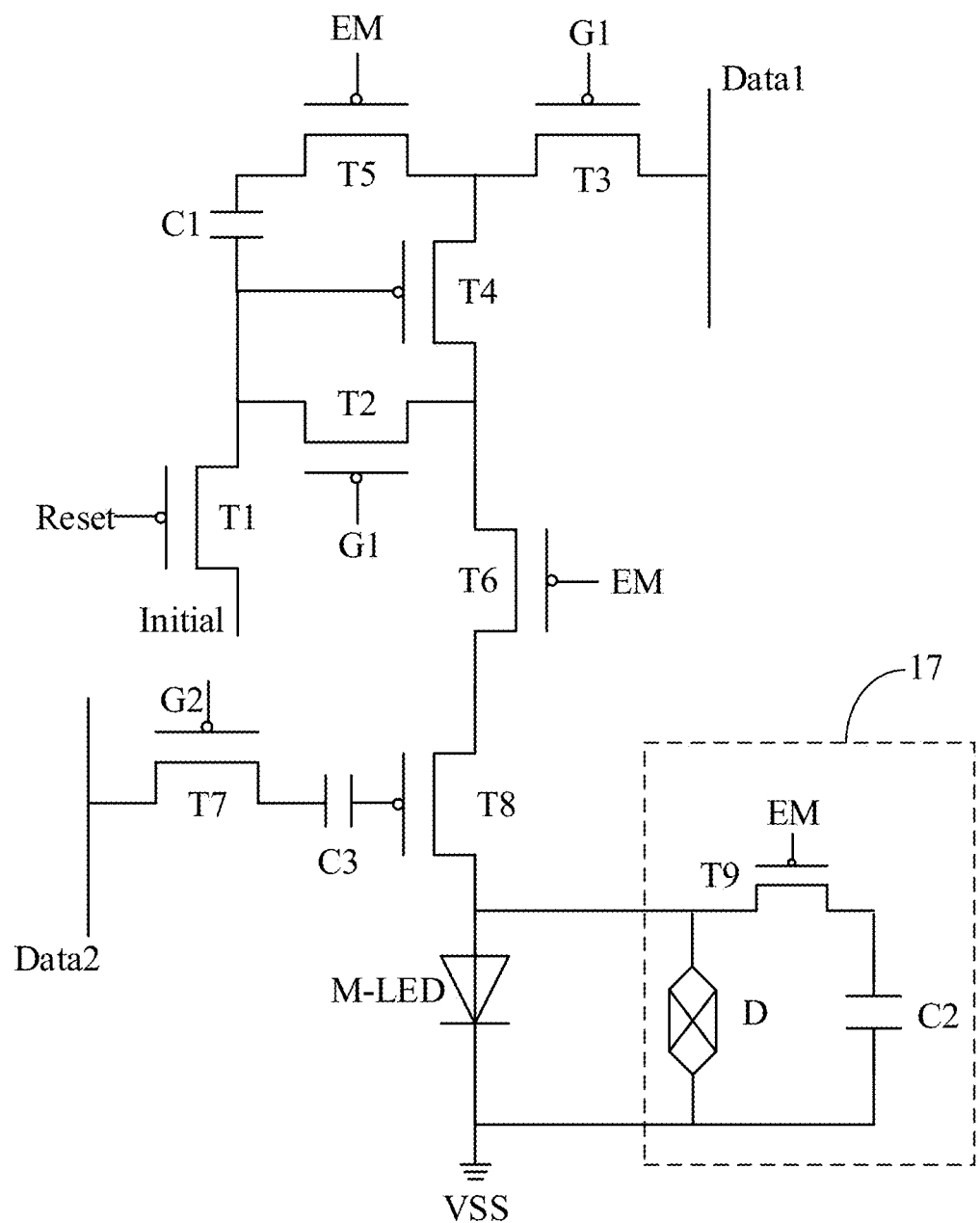
FIG. 1 is a schematic circuit diagram of a photoelectric conversion structure according to some embodiments of the present disclosure.
Figure 2:
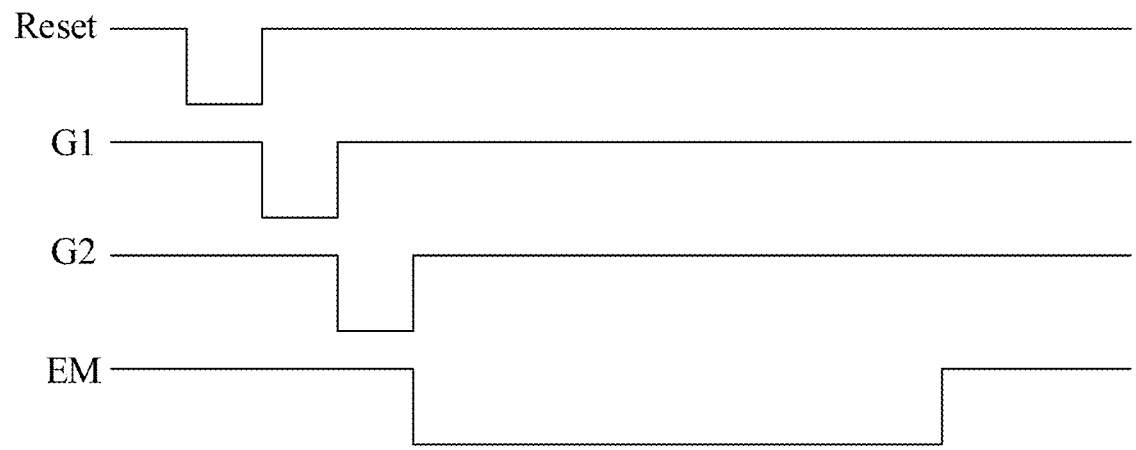
FIG. 2 is a timing sequence diagram of a pixel circuit according to some embodiments of the present disclosure.
Figure 3:
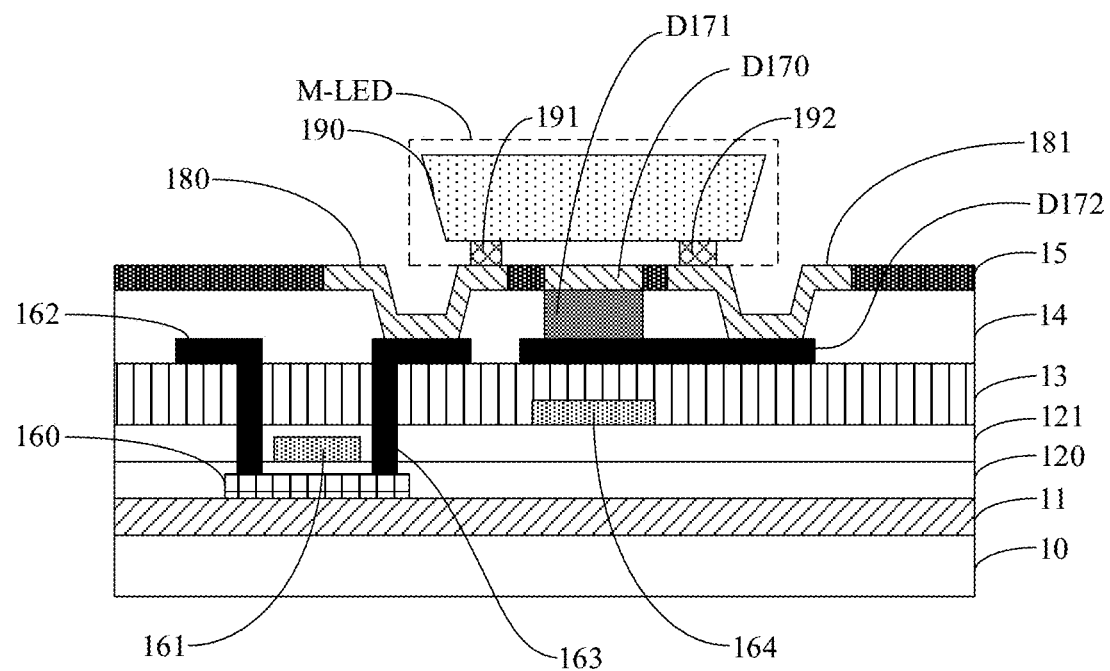
FIG. 3 is a first schematic cross-sectional view of a display panel according to some embodiments of the present disclosure.

Referring to FIG. 1 and FIG. 3, a display panel is provided in some embodiments of the present disclosure. The display panel includes an array substrate and a plurality of micro light-emitting diodes M-LED arranged on the array substrate, and further includes: a photoelectric conversion structure 17 in a one-to-one correspondence with a micro light-emitting diode M-LED. The photoelectric conversion structure 17 is located on a side of the corresponding micro light-emitting diode M-LED facing the array substrate, connected to the corresponding micro light-emitting diode M-LED, and configured to convert a received light signal emitted by the micro light-emitting diode M-LED into an electrical signal, and charge the corresponding micro light-emitting diode M-LED by using the electrical signal.

To be specific, the photoelectric conversion structure 17 is located on a side of the corresponding micro light-emitting diode M-LED away from a light-exiting surface of the display panel, and receives the light that is emitted by the micro light-emitting diode M-LED and cannot be used for a display of the display panel, thereby realizing a high utilization of the light in the display panel, and saving a power consumption.

To be specific, the above-mentioned array substrate may include a plurality of pixel driving circuits distributed in an array. The pixel driving circuits are in one-to-one correspondence with the micro light-emitting diodes M-LED, and each pixel driving circuit is configured to drive the corresponding micro light-emitting diode M-LED to emit light.

The photoelectric conversion structure 17 is provided on the side of the micro light-emitting diode M-LED away from the light-exiting surface of the display panel, such that the photoelectric conversion structure 17 may receive the light (i.e., the light signal) emitted by the micro light-emitting diode M-LED and in a direction away from the light-exiting surface of the display panel, convert the received light signal into the electrical signal, transmit the electrical signal to the corresponding micro light-emitting diode M-LED, and charge the corresponding micro light-emitting diode M-LED.

An external quantum efficiency EQE (i.e., the number of electrons/the number of photons) of the micro light-emitting diode may be set according to practical requirements. For example, the EQE is 30%. In a case that a conversion efficiency of the photoelectric conversion structure 17 is 10%, the photoelectric conversion structure 17 may compensate 3% of a current to the corresponding micro light-emitting diode M-LED at most, that is, the photoelectric conversion structure 17 may save 3% of the power consumption. It should be appreciated that, the power consumption that may be saved is related to the EQE of the micro light-emitting diode and the conversion efficiency of the photoelectric conversion structure 17. The larger the EQE is, the larger the conversion efficiency of the photoelectric conversion structure 17 is, and the more power consumption may be saved.

According to the specific structure of the display panel in the above embodiments, in the display panel of the embodiments of the present disclosure, the photoelectric conversion structure 17 is provided on the side of the micro light-emitting diode M-LED away from the light-exiting surface of the display panel. The photoelectric conversion structure 17 may receive the light emitted by the micro light-emitting diode M-LED and in the direction away from the light-exiting surface of the display panel, convert the received light signal into the electrical signal, transmit the electrical signal to the corresponding micro light-emitting diode M-LED, and charge the corresponding micro light-emitting diode M-LED. Therefore, the light that is emitted by the micro light-emitting diode M-LED and cannot be used for the display of the display panel may be converted into the electrical signal by the display panel of the embodiments of the present disclosure, and the corresponding micro light-emitting diode M-LED is charged by using the electrical signal, thereby realizing the high utilization of the light in the display panel.

There are various specific structures for the photoelectric conversion structure 17 in the above embodiments. As shown in FIG. 1 and FIG. 3, in some embodiments, the photoelectric conversion structure 17 includes: a photoelectric conversion diode D, a control transistor T9 and a storage capacitor C2. A first anode D170 of the photoelectric conversion diode D is connected to a second anode 191 of the corresponding micro light-emitting diode M-LED, and a first cathode D172 of the photoelectric conversion diode D is connected to a second cathode 192 of the corresponding micro light-emitting diode M-LED. A gate electrode of the control transistor T9 is connected to a light emission control signal input terminal EM, a first electrode of the control transistor T9 is connected to the second anode 191 of the corresponding micro light-emitting diode M-LED, and a second electrode of the control transistor T9 is connected to a first terminal of the storage capacitor C2. A second terminal of the storage capacitor C2 is connected to the second cathode 192 of the corresponding micro light-emitting diode M-LED.

To be specific, the pixel circuit in the array substrate in the above embodiments includes a variety of specific structures. For example, referring to FIG. 1, the pixel circuit includes a first transistor T1, a second transistor T2, a third transistor T3, a fourth transistor T4 (i.e., a driving transistor), a fifth transistor T5, a sixth transistor T6, a seventh transistor T7, an eighth transistor T8, a ninth transistor T9 (i.e., the control transistor T9), a first capacitor C1 and a third capacitor C3. A gate electrode of the first transistor T1 is connected to a reset control terminal Reset, a first electrode of the first transistor T1 is connected to a reset signal input terminal Initial, and a second electrode of the first transistor T1 is connected to a second electrode of the second transistor T2. A gate electrode of the second transistor T2 is connected to a first gate control signal input terminal G1, a first electrode of the second transistor T2 is connected to a second electrode of the fourth transistor T4, and a gate electrode of the fourth transistor T4 is connected to the second electrode of the second transistor T2. A first terminal of the first capacitor C1 is connected to a second electrode of the fifth transistor T5, and a second terminal of the first capacitor C1 is connected to the second electrode of the second transistor T2. A gate electrode of the fifth transistor T5 is connected to the light emission control signal input terminal EM, and a first electrode of the fifth transistor T5 is connected to a first electrode of the fourth transistor T4. A gate electrode of the third transistor T3 is connected to the first gate electrode control signal input terminal G1, a first electrode of the third transistor T3 is connected to a first data signal input terminal Data1, and a second electrode of the third transistor T3 is connected to the first electrode of the fourth transistor T4. A gate electrode of the sixth transistor T6 is connected to the light emission control signal input terminal EM, a first electrode of the sixth transistor T6 is connected to the second electrode of the fourth transistor T4, and a second electrode of the sixth transistor T6 is connected to a first electrode of the eighth transistor T8. A second electrode of the eighth transistor T8 is connected to the second anode 191 of the micro light-emitting diode M-LED, a gate electrode of the eighth transistor T8 is connected to a first terminal of the third capacitor C3, and a second terminal of the third capacitor C3 is connected to a second electrode of the seventh transistor T7. A first electrode of the seventh transistor T7 is connected to a second data signal input terminal Data2, a gate electrode of the seventh transistor T7 is connected to a second gate control signal input terminal G2, and the second cathode 192 of the micro light-emitting diode M-LED is connected to a ground signal line VSS.

In a case that the pixel circuit having the above structure is in operation, multiple operation periods are included, and each operation period includes: a reset phase, a compensation phase, a buffer phase, a light-emitting phase and a holding phase. During the reset phase, a reset control signal inputted from the reset control terminal Reset is a valid level (for example, a low level), the first transistor T1 is turned on to reset the first capacitor C1 and the gate electrode of the fourth transistor T4. During the compensation phase, a first gate electrode control signal inputted from the first gate electrode control signal input terminal G1 is a valid level, and a light emission control signal inputted from the light emission control signal input terminal EM is an invalid level. A threshold voltage compensation is performed on the fourth transistor T4 under the cooperation of the second transistor T2, the third transistor T3, the fourth transistor T4, the fifth transistor T5 and the capacitor C1. During the buffer phase, the first gate electrode control signal inputted from the first gate electrode control signal input terminal G1 is an invalid level, a light emission control signal inputted from the light emission control signal input terminal EM is an invalid level, and a second gate electrode control signal inputted from the second gate electrode control signal input terminal G2 is a valid level. Under the control of the second gate electrode control signal, the seventh transistor T7 is turned on, such that a second data signal provided by the second data signal input terminal Data2 is stored in the third capacitor C3. During the light-emitting phase, the first gate electrode control signal inputted from the first gate electrode control signal input terminal G1 is an invalid level, the light emission control signal inputted from the light emission control signal input terminal EM is a valid level, and the second gate electrode control signal inputted from the second gate electrode control signal input terminal G2 is an invalid level. The eighth transistor T8 is turned on under the control of the third capacitor C3, the pixel driving circuit generates a leakage current to drive the corresponding micro light-emitting diode M-LED to emit light.

During the light-emitting phase, the ninth transistor T9 is also turned on under the control of the light emission control signal inputted from the light emission control signal input terminal EM, and the photoelectric conversion diode D converts the received light signal emitted by the micro light-emitting diode M-LED into the electrical signal, and charges the storage capacitor C2 by using the electrical signal, and then the storage capacitor C2 charges the corresponding micro light-emitting diode M-LED by using the electrical signal stored by the storage capacitor C2, thereby saving the leakage current required by the micro light-emitting diode M-LED and effectively reducing the power consumption of micro light-emitting diode M-LED.

As shown in FIG. 3, in some embodiments, the array substrate includes the pixel driving circuits in a one-to-one correspondence with the micro light-emitting diodes M-LED, each pixel driving circuit includes a driving transistor, and an output electrode 163 of the driving transistor is connected to the second anode 191 of the corresponding micro light-emitting diode M-LED. The photoelectric conversion diode includes the first anode D170, a PIN junction D171 and the first cathode D172 that are sequentially stacked. The first anode D170 is located between the corresponding micro light-emitting diode M-LED and the first cathode D172, and the first anode D170 includes a transparent electrode, and the first cathode D172 and the output electrode 163 of the driving transistor are arranged at a same layer and made of a same material.

To be specific, the driving transistor may include an active layer 160, a first gate electrode 161, an input electrode 162 and the output electrode 163. A process of manufacturing the driving transistor is as follows. Firstly, the active layer 160 is formed on a substrate 10 formed with a buffer layer 11. Next, a first insulation layer 120 is formed to cover the active layer 160, and the first gate electrode 161 is formed on a side of the first insulation layer 120 away from the substrate 10. An orthographic projection of the first gate electrode 161 on the substrate 10 is within an orthographic projection of the active layer 160 on the substrate 10. Next, a second insulation layer 121 is formed on a side of the first gate electrode 161 away from the substrate 10, and a third insulation layer 13 is formed on a side of the second insulation layer 121 away from the substrate 10. Next, a first connecting hole and a second connecting hole penetrating the first insulation layer 120, the second insulation layer 121 and the third insulation layer 13 are formed, and the first connecting hole and the second connecting hole are separate from each other and may both expose a part of the active layer 160. Finally, the output electrode 163 and the input electrode 162 of the driving transistor are formed on a side of the third insulation layer 13 away from the substrate 10. The output electrode 163 and the input electrode 162 are respectively electrically connected to the active layer 160 through the first connection hole and the second connection hole.

In a case that the photoelectric conversion diode includes the first anode D170, the PIN junction D171 and the first cathode D172, the first cathode D172 and the output electrode 163 of the driving transistor may be arranged at a same layer and made of a same material, such that the input electrode 162 and the output electrode 163 of the driving transistor, the first cathode D172 of the photoelectric conversion diode may be formed simultaneously in one patterning process, thereby avoiding an additional process for manufacturing the first cathode D172, effectively simplifying the manufacturing process of the photoelectric conversion diode and saving manufacturing costs.

The driving transistor may further include a second gate electrode 164. The storage capacitor C2 included in the photoelectric conversion structure 17 is formed between the first gate electrode 161 and the second gate electrode 164, that is, the first gate electrode 161 and the second gate electrode 164 are used as two electrode plates of the storage capacitor. The first anode D170 of the photoelectric conversion diode is connected to one of the first gate electrode 161 and the second gate electrode 164, and the first cathode D172 of the photoelectric conversion diode is connected to the other of the first gate electrode 161 and the second gate electrode 164.

It should be appreciated that, the substrate 10 may be a glass substrate, the buffer layer 11 may be made of SiNx and/or SiOx, the first insulation layer 120 and the second insulation layer 121 may be made of SiOx, and the third insulation layer 13 may be made of SiNx and/or SiOx. The input electrode 162, output electrode 163 of the driving transistor and the first cathode D172 of the photoelectric conversion diode may be made of a metal material, and the first anode D170 of the photoelectric conversion diode may be made of a transparent conductive material such as indium tin oxide (ITO).

In some embodiments, the display panel further includes: a planarization layer 14 located between the array substrate and the plurality of micro light-emitting diodes M-LED and including a first via hole, a second via hole and a third via hole that are separate from each other; a pixel electrode 180 located on a side of the planarization layer 14 away from the array substrate and connected to the output electrode 163 of the corresponding driving transistor through the first via hole; a connection electrode 181 located on the side of the planarization layer 14 away from the array substrate and connected to the first cathode D172 through the second via hole. The PIN junction D171 is located in the third via hole and connected to the first cathode D172 through the third via hole, and the first anode D170, the pixel electrode 180 and the connection electrode 181 are arranged at a same layer and made of a same material. The second anode 191 of the micro light-emitting diode M-LED is connected to the corresponding pixel electrode 180, and the second cathode 192 of the micro light-emitting diode M-LED is connected to the corresponding connection electrode 181.

To be specific, after forming the input electrode 162, the output electrode 163 of the driving transistor and the first cathode D172 of the photoelectric conversion diode, the planarization layer 14 may be subsequently formed. The planarization layer 14 covers entirely the input electrode 162, the output electrode 163 of the driving transistor and the first cathode D172 of the photoelectric conversion diode. Next, the first via hole, the second via hole and the third via hole that are separate from each other are formed on the planarization layer 14. The first via hole may expose at least a part of the output electrode 163 of the driving transistor, the second via hole and the third via hole may expose a part of the first cathode D172 of the photoelectric conversion diode D. Next, the PIN junction D171 of the photoelectric conversion diode may be formed in the third via hole, and the PIN junction D171 is connected to the part of the first cathode D172, and may fill up the third via hole, or only fill a part of the third via hole. Finally, the pixel electrode 180, the connection electrode 181 and the first anode D170 of the photoelectric conversion diode D may be simultaneously formed in one patterning process. The pixel electrode 180 is connected to the output electrode 163 of the corresponding driving transistor through the first via hole, the connection electrode 181 is connected to the first cathode D172 through the second via hole, and the first anode D170 is connected to the PIN junction D171. In addition, the display panel may further include a passivation layer 15 formed on the planarization layer 14.

When forming the first anode D170, the pixel electrode 180 and the connection electrode 181, the first anode D170, the pixel electrode 180 and the connection electrode 181 may be arranged at a same layer and made of a same material, such that the first anode D170, the pixel electrode 180 and the connection electrode 181 may be simultaneously formed in one patterning process, thereby avoiding an additional process for manufacturing the first anode D170, effectively simplifying the manufacturing process of the photoelectric conversion diode and saving the manufacturing costs.

It should be appreciated that, the first cathode D172 of the photoelectric conversion diode may be multiplexed as the ground signal line in the display panel, that is, a ground signal is applied to the first cathode D172, such that both the second cathode 192 of the micro light-emitting diode M-LED and the second terminal of the storage capacitor may be connected to the first cathode D172.

After the photoelectric conversion diode is formed, the micro light-emitting diode M-LED may be subsequently bonded on the array substrate, such that the second anode 191 of the micro light-emitting diode M-LED is connected to the corresponding pixel electrode 180, and the second cathode 192 of the micro light-emitting diode M-LED is connected to the corresponding connection electrode 181.

In addition, it should be appreciated that, since a bonding position of the micro light-emitting diode M-LED is related to positions of the pixel electrode 180 and the connection electrode 181 which the micro light-emitting diode M-LED is connected to, the micro light-emitting diode M-LED may be bonded to a position that meets the requirements by setting the positions of the pixel electrode 180 and the connection electrode 181. For example, the photoelectric conversion diode is arranged between the corresponding pixel electrode 180 and the corresponding connection electrode 181. In this way, after the micro light-emitting diode M-LED is bonded, the photoelectric conversion diode may be located just below the corresponding micro light-emitting diode M-LED, such that the photoelectric conversion diode may receive the light emitted by the micro light-emitting diode M-LED downward, and convert the light into the electrical signal.

Figure 4:
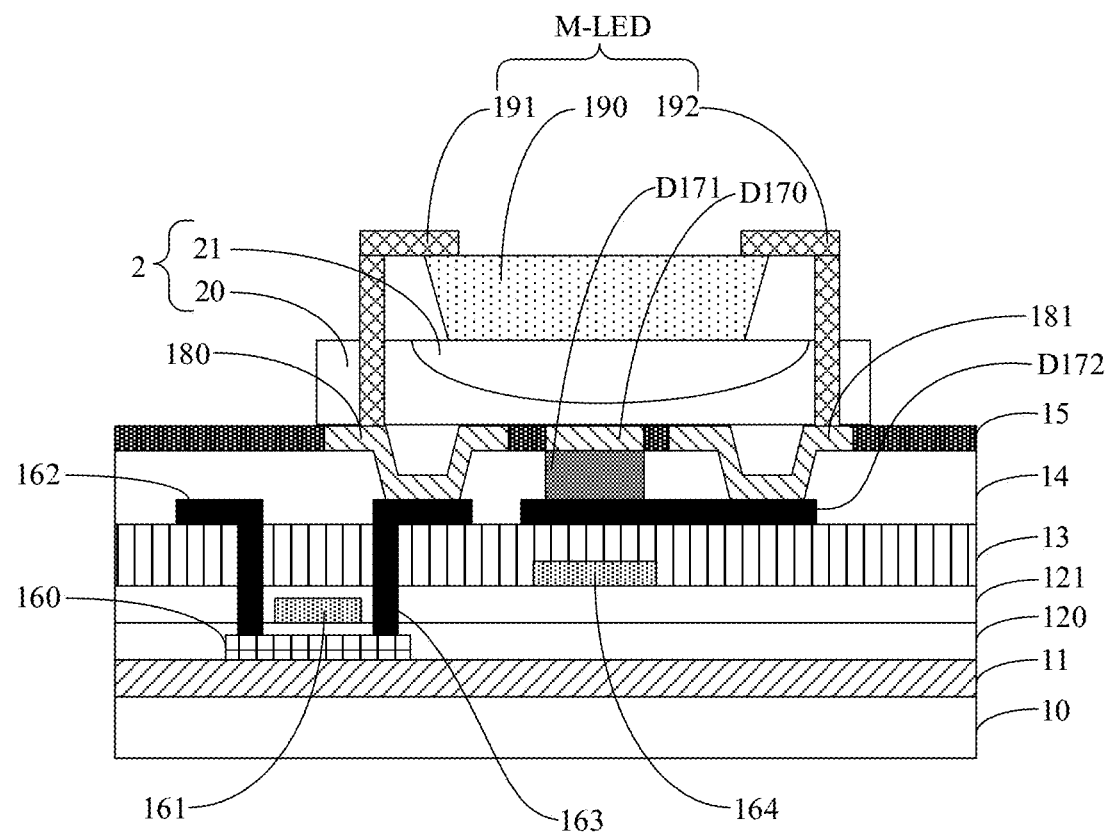
FIG. 4 is a second schematic cross-sectional view of a display panel according to some embodiments of the present disclosure.

As shown in FIG. 4, in some embodiments, the display panel may further include a lens structure 2 in a one-to-one correspondence with the micro light-emitting diode M-LED. The lens structure 2 is located between the corresponding micro light-emitting diode M-LED and the corresponding photoelectric conversion structure 17, and configured to converge the light emitted by the corresponding micro light-emitting diode M-LED and transmit the same to the corresponding photoelectric conversion structure 17.

To be specific, when the micro-light-emitting diode M-LED emits light, the light may be emitted towards and around the micro-light-emitting diode M-LED. In order to increase the amount of light received by the photoelectric conversion diode, the lens structure 2 may be arranged between the micro light-emitting diode M-LED and the corresponding photoelectric conversion structure 17, such that the lens structure 2 may converge some light that may only reach the lens structure 2 but not directly reach the photoelectric conversion diode, and transmit the converged light to the corresponding photoelectric conversion structure 17.

In the display panel of the above embodiments, the lens structure 2 is provided between the corresponding micro light-emitting diode M-LED and the corresponding photoelectric conversion structure 17, which effectively increase the amount of the light received by the photoelectric conversion diode, such that a stronger electrical signal may be converted and obtained by the photoelectric conversion diode, and a more effective current compensation for the micro light-emitting diode M-LED may be realized.

In some embodiments, the lens structure 2 includes a groove part 20 and a filling part 21 filled in the groove part 20. An opening of the groove part 20 faces the micro light-emitting diode M-LED, and an inner wall of the groove part 20 is of an arc-shape. A surface of the filling part 21 away from the groove part 20 and a surface surrounding the opening in the groove part 20 together form a flat surface, and a refractive index of the filling part 21 is larger than a refractive index of the groove part 20. An orthographic projection of a PN junction 190 of the micro light-emitting diode M-LED on a substrate 10 of the array substrate is within an orthographic projection of the filling part 21 on the substrate 10.

To be specific, the lens structure 2 having the above structure may be manufactured in advance and then mounted on the array substrate formed with the photoelectric conversion diode, or the lens structure 2 may also be directly manufactured on the array substrate formed with the photoelectric conversion diode.

For example, when the lens structure 2 is directly manufactured on the array substrate formed with the photoelectric conversion diode, the groove part 20 may be formed on a side of the photoelectric conversion diode away from the substrate 10 by using a resin material having a small refractive index first. To be specific, an embossing process may be used. After the groove part 20 is formed, the filling part 21 may be formed in a groove of the groove part 20 by using a resin material having a large refractive index, and the surface of the filling part 21 away from the groove part 20 and the surface surrounding the opening in the groove part 20 together form the flat surface.

In the lens structure 2 having the above structure, the inner wall of the groove part 20 is of an arc shape, such that the filling part 21 formed in the groove part 20 is of a convex lens shape, thereby realizing convergence of the light passing through the filling part 21.

It should be appreciated that, a specific formation position of the lens structure 2 may be set according to practical requirements. For example, a center of the lens structure 2 may be aligned with a center of the photoelectric conversion diode. At the same time, in this structure, when the pixel electrode 180 and the connection electrode 181 are located on opposite sides of the corresponding photoelectric conversion diode, two via holes may be formed on the groove part 20 of the corresponding lens structure 2, and one of the two via holes may expose at least a part of the corresponding pixel electrode 180, the other of the two via holes may expose at least a part of the corresponding connection electrode 181, such that after the micro light-emitting diode M-LED is bonded on the array substrate, the second anode 191 of the micro light-emitting diode M-LED may be electrically connected to the corresponding pixel electrode 180 and the second cathode 192 of the micro light-emitting diode M-LED may be electrically connected to the corresponding connection electrode 181 through the two via holes.

In addition, when bonding the micro light-emitting diode M-LED, the orthographic projection of the PN junction 190 of the micro light-emitting diode M-LED on the substrate 10 of the array substrate may be within the orthographic projection of the filling part 21 on the substrate 10. In this way, the lens structure 2 may collect the light emitted by the micro light-emitting diode M-LED towards the sides of the micro light-emitting diode M-LED in a better way, and the light towards the sides of the micro light-emitting diode M-LED is also converged and transmitted to the corresponding photoelectric conversion diode, which is more beneficial for saving the current required by the micro light-emitting diode M-LED, thereby effectively reducing the power consumption.

In addition, it should be appreciated that, in the display panel of the above embodiments, specific positions of the bonded micro light-emitting diode M-LED, the formed lens structure 2 and the photoelectric conversion diode may be set according to practical requirements. For example, the lens structure 2 may be set on the side of the micro light-emitting diode M-LED away from the array substrate, such that the light emitted by the micro light-emitting diode M-LED towards the sides of the micro light-emitting diode M-LED may be collected to the side (i.e., a display side of the display panel) of the micro light-emitting diode M-LED away from the array substrate, thereby realizing a high utilization of the light in the display panel. Or, as described in the above embodiments, the lens structure 2 may be arranged between the corresponding micro light-emitting diode M-LED and the photoelectric conversion structure 17. Thus, even a center position of the micro light-emitting diode M-LED does not coincide with a center position of the corresponding lens structure 2 in a direction perpendicular to the substrate 10 due to a binding error, which causes that a type of the light emitted by the lens structure 2 and a type of the light arriving the lens structure 2 are different from each other, neither a photoelectric conversion effect of the photoelectric conversion diode nor a display effect of the display panel is adversely affect.

In some embodiments, the PN junction 190 of the micro light-emitting diode M-LED may be set to be located on a focal plane of the corresponding lens structure 2, or the PN junction 190 of the micro light-emitting diode M-LED may be set to be located on the flat surface.

Specifically, in a case that the micro light-emitting diode M-LED is actually bonded, a distance between the micro light-emitting diode M-LED and the corresponding lens structure 2 may be set according to practical requirements. In a case that the PN junction 190 of the micro light-emitting diode M-LED is set be located on the focal plane of the corresponding lens structure 2, the lens structure 2 may realize a better light-converging effect, and the photoelectric conversion structure 17 may perform the current compensation on the micro light-emitting diode M-LED in a better way. In a case that the PN junction 190 of the micro light-emitting diode M-LED is set to be located on the flat surface, the lens structure 2 may realize the light-converging effect as well. Moreover, since there is no need to add an extra part on the flat surface to support the micro light-emitting diode M-LED, a thickness of the display panel may be smaller and a manufacturing process may be more simplified.

In addition, it should be appreciated that, a curvature radius of the filling part 21 in the lens structure 2 and a setting height of the micro light-emitting diode M-LED relative to the lens structure 2 may be calculated and determined in accordance with specifications of the micro light-emitting diode M-LED.

Figure 5:
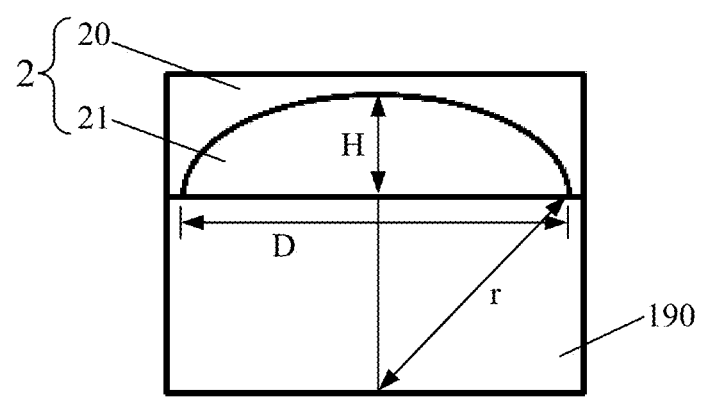
FIG. 5 is a schematic diagram of a lens structure according to some embodiments of the present disclosure.

In more detail, as shown in FIG. 5, according to a size of the micro light-emitting diode M-LED bonded in the display panel (i.e., a size of a sub-pixel unit), an aperture D (i.e., a maximum width of the filling part 21 in a direction parallel to the array substrate) of the filling part 21, an arch height H (i.e., a maximum depth of the filling part 21 in a direction perpendicular to the array substrate) and a focal length f of the corresponding lens structure 2 may be simulated and calculated. A simulation calculation may be performed by using the following formulas.

$$f = \frac{n_1 r}{n_2 - n_3} \quad (1)$$

$$\frac{D^2}{4} + (r - H)^2 = r^2 \quad (2)$$

$$n_2 - n_3 = \frac{n_1 r}{f} \geq \frac{n_1 D}{2f} \quad (3)$$

Where, D represents an aperture of the lens structure, f represents the focal length of the lens structure, r represents a curvature radius of the lens structure, H represents the arch height, n1 represents a refractive index of the PN junction 190 of the micro light-emitting diode M-LED, n2 represents the refractive index of the filling part 21, and n3 represents the refractive index of the groove part 20.

A display panel including the above-mentioned display panel is further provided in some embodiments of the present disclosure.

The light that is emitted by the micro light-emitting diode M-LED and cannot be used for the display of the display panel may be converted into the electrical signal by the display panel of the above embodiments, and the corresponding micro light-emitting diode M-LED is charged by using the electrical signal, thereby realizing the high utilization of the light in the display panel. Therefore, in a case that the display device in the embodiments of the present disclosure includes the above-mentioned display panel, it also has the above-mentioned beneficial effects, which is not be repeated herein.

It should be appreciated that, the display device may be any product or component having a display function such as a television, a monitor, a digital photo frame, a mobile phone or a tablet computer.

A method of manufacturing the display panel is further provided in some embodiments of the present disclosure, including: forming the array substrate, forming the plurality of photoelectric conversion structures 17 arranged on the array substrate, and forming the plurality of micro light-emitting diodes M-LED on the side of the plurality of photoelectric conversion structures 17 away from the array substrate. The plurality of micro light-emitting diodes M-LED are in one-to-one correspondence with the plurality of photoelectric conversion structures 17, the photoelectric conversion structure 17 is connected to the corresponding micro light-emitting diode M-LED, and configured to convert the received light signal emitted by the micro light-emitting diode M-LED into the electrical signal, and charge the corresponding micro light-emitting diode M-LED by using the electrical signal.

To be specific, the formed array substrate may include a plurality of pixel driving circuits distributed in an array. The pixel driving circuits are in one-to-one correspondence with the micro light-emitting diodes M-LED, and each pixel driving circuit is configured to drive the corresponding micro light-emitting diode M-LED to emit light. After forming the array substrate, the plurality of photoelectric conversion structures 17 may be formed on a side of the pixel driving circuits away from the substrate 10 of the array substrate and in one-to-one correspondence with the pixel driving circuits. The plurality of micro light-emitting diodes M-LED are formed on the side of the photoelectric conversion structures 17 away from the array substrate and connected to the photoelectric conversion structures 17 in one-to-one correspondence.

The photoelectric conversion structure 17 is provided on the side of the micro light-emitting diode M-LED away from the light-exiting surface of the display panel, such that the photoelectric conversion structure 17 may receive the light (i.e., the light signal) emitted by the micro light-emitting diode M-LED and in the direction away from the light-exiting surface of the display panel, convert the received light signal into the electrical signal, transmit the electrical signal to the corresponding micro light-emitting diode M-LED, and charge the corresponding micro light-emitting diode M-LED.

In the display panel manufactured by using the method in the embodiments of the present disclosure, the photoelectric conversion structure 17 is provided on the side of the micro light-emitting diode M-LED away from the light-exiting surface of the display panel. The photoelectric conversion structure 17 may receive the light emitted by the micro light-emitting diode M-LED and in the direction away from the light-exiting surface of the display panel, convert the light into the electrical signal, transmit the electrical signal to the corresponding micro light-emitting diode M-LED, and charge the corresponding micro light-emitting diode M-LED. Therefore, the light emitted by the micro light-emitting diode M-LED that cannot be used for the display of the display panel may be converted into the electrical signal in the display panel manufactured by using the method in the embodiments of the present disclosure, and the corresponding micro light-emitting diode M-LED is charged by using the electrical signal, thereby realizing the high utilization of the light in the display panel A method of driving the display panel is further provided in some embodiments of the present disclosure, including: in a brightness compensation step, converting, by the photoelectric conversion structure 17 in the display panel, the received light signal emitted by the micro light-emitting diode M-LED into the electrical signal, and charging the corresponding micro light-emitting diode M-LED by using the electrical signal.

When the above-mentioned display panel is driven by using the driving method in the embodiments of the present disclosure, the photoelectric conversion structure 17 may receive the light (i.e., the light signal) emitted by the micro light-emitting diode M-LED and in the direction away from the light-exiting surface of the display panel, convert the received light signal into the electrical signal, transmit the electrical signal to the corresponding micro light-emitting diode M-LED, and charge the corresponding micro light-emitting diode M-LED. Therefore, in a case that the above-mentioned display panel is driven by using the driving method in the embodiments of the present disclosure, the light emitted by the micro light-emitting diode M-LED that cannot be used for the display of the display panel may be converted into the electrical signal, and the corresponding micro light-emitting diode M-LED is charged by using the electrical signal, thereby realizing the high utilization of the light in the display panel.

It should be noted that each embodiment in the specification is described in a progressive manner, and same or similar parts between various embodiments may be referred to among the embodiments. Each embodiment focuses on the differences from other embodiments. In particular, as for the method embodiment, since it is basically similar to the product embodiment, the method embodiment is described relatively simply, and the relevant part may be referred to in the description of the product embodiment.

Unless defined otherwise, technical or scientific terms used in the present disclosure shall have general meanings as understood by those with ordinary skills in the art. Terms "first", "second" and similar terms used in the present disclosure do not indicate any order, quantity or priority, but are used only for distinguishing different components. An expression such as "include" or "have" indicates that a component or article preceding the term encompasses components, articles or other equivalents listed after the term, without excluding other components or articles. A term "connect", "attach" or other term with similar meaning is not limited to a physical connection or a mechanical connection, but may include an electrical connection, whether direct or indirect. "Up", "down", "left", "right" and the like are only used to represent a relative position relationship. When an absolute position of a described object is changed, the relative position relationship may also change correspondingly.

It should be appreciated that, when a component such as a layer, film, region or substrate is referred to as being located "above" or "below" another component, the component may be "directly" located "above" or "below" another component, or intermediary components may exist.

In the description of the foregoing embodiments, specific features, structures, materials, or characteristics may be combined in a suitable manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A display panel, comprising an array substrate and a plurality of micro light-emitting diodes arranged on the array substrate,
    wherein the display panel further comprises a plurality of photoelectric conversion structures in a one-to-one correspondence with the plurality of micro light-emitting diode, the photoelectric conversion structure is located on a side of the corresponding micro light-emitting diode facing the array substrate, connected to the corresponding micro light-emitting diode, and configured to convert a received light signal emitted by the corresponding micro light-emitting diode into an electrical signal, and charge the corresponding micro light-emitting diode by using the electrical signal,
    wherein the photoelectric conversion structure comprises: a photoelectric conversion diode, a control transistor and a storage capacitor,
    wherein a first anode of the photoelectric conversion diode is connected to a second anode of the corresponding micro light-emitting diode, a first cathode of the photoelectric conversion diode is connected to a second cathode of the corresponding micro light-emitting diode,
    wherein a gate electrode of the control transistor is connected to a light emission control signal input terminal, a first electrode of the control transistor is connected to the second anode of the corresponding micro light-emitting diode, a second electrode of the control transistor is connected to a first terminal of the storage capacitor,
    wherein a second terminal of the storage capacitor is connected to the second cathode of the corresponding micro light-emitting diode,
    wherein the array substrate comprises a plurality of pixel driving circuits in a one-to-one correspondence with the plurality of micro light-emitting diodes, each pixel driving circuit comprises a driving transistor, an output electrode of the driving transistor is connected to the second anode of the corresponding micro light-emitting diode, and
    wherein the photoelectric conversion diode comprises the first anode, a PIN junction and the first cathode that are sequentially stacked, and the first anode is located between the corresponding micro light-emitting diode and the first cathode.

2. The display panel according to claim 1, wherein the first anode comprises a transparent electrode, and the first cathode and the output electrode of the driving transistor are arranged at a same layer and made of a same material.

3. The display panel according to claim 1, wherein the driving transistor further comprises a first gate electrode and a second gate electrode, the first gate electrode and the second gate electrode form the storage capacitor.

4. The display panel according to claim 1, further comprising:
    a planarization layer located between the array substrate and the plurality of micro light-emitting diodes and comprising a first via hole, a second via hole and a third via hole that are separate from each other;
    a pixel electrode located on a side of the planarization layer away from the array substrate and connected to the output electrode of the corresponding driving transistor through the first via hole; and
    a connection electrode located on the side of the planarization layer away from the array substrate and connected to the first cathode through the second via hole;
    wherein the PIN junction is located in the third via hole and connected to the first cathode through the third via hole,
    the second anode of the micro light-emitting diode is connected to the corresponding pixel electrode, and the second cathode of the micro light-emitting diode is connected to the corresponding connection electrode.

5. The display panel according to claim 4, wherein the first anode, the pixel electrode and the connection electrode are arranged at a same layer and made of a same material.

6. A display device comprising the display panel according to claim 1.

7. A method of manufacturing the display panel according to claim 1, comprising:
    forming the array substrate;
    forming the plurality of photoelectric conversion structures arranged on the array substrate; and
    forming the plurality of micro light-emitting diodes on the side of the plurality of photoelectric conversion structures away from the array substrate, wherein the plurality of micro light-emitting diodes are in one-to-one correspondence with the plurality of photoelectric conversion structures, the photoelectric conversion structure is connected to the corresponding micro light-emitting diode, and configured to convert the received light signal emitted by the micro light-emitting diode into the electrical signal, and charge the corresponding micro light-emitting diode by using the electrical signal.

8. A method of driving the display panel according to claim 1, comprising:
    in a brightness compensation step, converting, by the photoelectric conversion structure in the display panel, the received light signal emitted by the micro light-emitting diode into the electrical signal, and charging the corresponding micro light-emitting diode by using the electrical signal.

9. A display panel, comprising:
an array substrate;
a plurality of micro light-emitting diodes arranged on the array substrate;
a plurality of photoelectric conversion structures in a one-to-one correspondence with the plurality of micro light-emitting diode, the photoelectric conversion structure is located on a side of the corresponding micro light-emitting diode facing the array substrate, connected to the corresponding micro light-emitting diode, and configured to convert a received light signal emitted by the corresponding micro light-emitting diode into an electrical signal, and charge the corresponding micro light-emitting diode by using the electrical signal; and
a plurality of lens structures in a one-to-one correspondence with the plurality of micro light-emitting diodes, wherein the lens structure is located between the corresponding micro light-emitting diode and the corresponding photoelectric conversion structure, and configured to converge the light emitted by the corresponding micro light-emitting diode and transmit the light to the corresponding photoelectric conversion structure.

10. The display panel according to claim 9, wherein the lens structure comprises:
a groove part, wherein an opening of the groove part faces the micro light-emitting diode, and an inner wall of the groove part is of an arc-shape; and
a filling part filled in the groove part, wherein a surface of the filling part away from the groove part and a surface surrounding the opening in the groove part together form a flat surface, and a refractive index of the filling part is larger than a refractive index of the groove part.

11. The display panel according to claim 10, wherein an orthographic projection of a PN junction of the micro light-emitting diode on a substrate of the array substrate is within an orthographic projection of the filling part on the substrate.

12. The display panel according to claim 10, wherein the PN junction of the micro light-emitting diode is located on a focal plane of the corresponding lens structure.

13. The display panel according to claim 10, wherein the PN junction of the micro light-emitting diode is located on the flat surface.

14. The display panel according to claim 10, wherein a maximum width D of the filling part in a direction parallel to the array substrate, a maximum depth H of the filling part in a direction perpendicular to the array substrate, and a focal length f are calculated by using the following formulas:

$$f = \frac{n_1 r}{n_2 - n_3} \quad (1)$$

$$\frac{D^2}{4} + (r-H)^2 = r^2 \quad (2)$$

$$n_2 - n_3 = \frac{n_1 r}{f} \geq \frac{n_1 D}{2f} \quad (3)$$

wherein, r represents a curvature radius of the filling part, n1 represents a refractive index of the PN junction of the micro light-emitting diode, n2 represents the refractive index of the filling part, and n3 represents the refractive index of the groove part.

15. A display panel, comprising an array substrate and a plurality of micro light-emitting diodes arranged on the array substrate,
wherein the display panel further comprises a plurality of photoelectric conversion structures in a one-to-one correspondence with the plurality of micro light-emitting diode, the photoelectric conversion structure is located on a side of the corresponding micro light-emitting diode facing the array substrate, connected to the corresponding micro light-emitting diode, and configured to convert a received light signal emitted by the corresponding micro light-emitting diode into an electrical signal, and charge the corresponding micro light-emitting diode by using the electrical signal;
the array substrate comprises a plurality of pixel driving circuits in a one-to-one correspondence with the plurality of micro light-emitting diodes, each pixel driving circuit comprises the photoelectric conversion structure comprising a photoelectric conversion diode, a ninth transistor and a storage capacitor,
a first anode of the photoelectric conversion diode is connected to a second anode of the corresponding micro light-emitting diode, a first cathode of the photoelectric conversion diode is connected to a second cathode of the corresponding micro light-emitting diode,
a gate electrode of the ninth transistor is connected to a light emission control signal input terminal, a first electrode of the ninth transistor is connected to the second anode of the corresponding micro light-emitting diode, a second electrode of the ninth transistor is connected to a first terminal of the storage capacitor;
a second terminal of the storage capacitor is connected to the second cathode of the corresponding micro light-emitting diode;
each pixel driving circuit further comprises a first transistor, a second transistor, a third transistor, a fourth transistor, a fifth transistor, a sixth transistor, a seventh transistor, an eighth transistor, a first capacitor and a third capacitor,
a gate electrode of the first transistor is connected to a reset control terminal, a first electrode of the first transistor is connected to a reset signal input terminal, and a second electrode of the first transistor is connected to a second electrode of the second transistor, a gate electrode of the second transistor is connected to a first gate control signal input terminal, a first electrode of the second transistor is connected to a second electrode of the fourth transistor, and a gate electrode of the fourth transistor is connected to the second electrode of the second transistor, a first terminal of the first capacitor is connected to a second electrode of the fifth transistor, and a second terminal of the first capacitor is connected to the second electrode of the second transistor, a gate electrode of the fifth transistor is connected to the light emission control signal input terminal, and a first electrode of the fifth transistor is connected to a first electrode of the fourth transistor, a gate electrode of the third transistor is connected to the first gate electrode control signal input terminal, a first electrode of the third transistor is connected to a first data signal input terminal, and a second electrode of the third transistor is connected to the first electrode of the fourth transistor, a gate electrode of the sixth transistor is connected to the light emission control signal input terminal, a first electrode of the sixth transistor is connected to the second electrode of the fourth transistor, and a second electrode of the sixth transistor is connected to a first electrode of the eighth transistor, a second electrode of the eighth transistor is connected to the second anode of the micro light-emitting diode, a gate electrode of the eighth transistor is connected to a first terminal of the third capacitor, and a second terminal of the third capacitor is connected to a second electrode of the seventh transistor, a first electrode of the seventh transistor is connected to a second data signal input terminal, a gate electrode of the seventh transistor is connected to a second gate control signal input terminal, and the second cathode of the micro light-emitting diode is connected to a ground signal line.

\* \* \* \* \*